(12) United States Patent
Wang et al.

(10) Patent No.: US 7,349,232 B2
(45) Date of Patent: Mar. 25, 2008

(54) 6F² DRAM CELL DESIGN WITH 3F-PITCH FOLDED DIGITLINE SENSE AMPLIFIER

(75) Inventors: Fei Wang, Boise, ID (US); Anton P. Eppich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 11/376,458

(22) Filed: Mar. 15, 2006

(65) Prior Publication Data
US 2007/0217245 A1   Sep. 20, 2007

(51) Int. Cl.
*G11C 5/06* (2006.01)
(52) U.S. Cl. .................... 365/63; 365/69; 365/149; 365/206
(58) Field of Classification Search .......... 365/63, 365/69, 149, 206
See application file for complete search history.

(56) References Cited

U.S. PATENT DOCUMENTS

| 6,243,311 | B1 * | 6/2001 | Keeth | 365/206 |
| 6,671,217 | B2 * | 12/2003 | Takemura et al. | 365/205 |
| 6,809,364 | B2 * | 10/2004 | Matsuoka et al. | 257/296 |
| 6,861,691 | B2 * | 3/2005 | Tran | 257/296 |
| 2007/0049015 | A1 * | 3/2007 | Nejad et al. | 438/649 |

* cited by examiner

*Primary Examiner*—Hoai V. Ho
(74) *Attorney, Agent, or Firm*—Williams, Morgan & Amerson

(57) ABSTRACT

The present invention is generally directed to a DRAM cell design with folded digitline sense amplifier. In one illustrative embodiment, a memory array having a plurality of memory cells having an effective size of 6F² is disclosed which has a plurality of dual bit active areas, each of the active areas having a substantially longitudinal axis, and a plurality of digitlines on a 3F-pitch arranged in a folded digitline architecture, wherein the active areas are positioned such that the longitudinal axis of the active areas is oriented at an angle with respect to a centerline of the digitlines.

27 Claims, 7 Drawing Sheets

# 6F² DRAM CELL DESIGN WITH 3F-PITCH FOLDED DIGITLINE SENSE AMPLIFIER

BACKGROUND OF THE INVENTION

1. Field of the Invention

The present invention is generally related to the field of DRAM architecture, and, more particularly, to a 6F² DRAM architecture with a 3F-pitch folded digitline sense amplifier.

2. Description of the Related Art

Memory devices are typically provided as internal storage areas in the computer There are several different types of memory. One type of memory is random access memory (RAM) that is typically used as main memory in a computer environment. Most RAM is volatile, which means that it requires a steady flow of electricity to maintain its contents.

A dynamic random access memory (DRAM) is made up of memory cells. Each cell of a modern DRAM includes a transistor and a capacitor, where the capacitor holds the value of each cell, namely a "1" or a "0", as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

Referring to FIG. 1, a schematic diagram of an illustrative DRAM memory cell 10 is depicted. The cell 10 is illustrated as having a capacitor 12 and an access transistor 14. The capacitor 12 is used to store a charge. The charge represents a bit of information. The access transistor 14 acts as a switch for the capacitor 12. That is, the access transistor 14 controls when a charge is placed on the capacitor 12, and when a charge is discharged from the capacitor 12. A word line 16 is coupled to a control gate of the access transistor 14. When a cell is read, the word line 16 activates the control gate of the transistor 14. Once this happens, any charge (or lack of charge) stored on the capacitor 12 is shared with a conductive digitline 18 coupled to the drain of the access transistor 14. This charge is then detected in the digitline 18 by a sense amplifier (not shown) and then processed to determine the bit state of the cell 10. Tiling a selected quantity of cells 10 together, such that the cells 10 along a given digitline 18 do not share a common word line 16 and the cells 10 along a common word line 16 do not share a common digitline 18, forms a memory array. A typical memory array contains thousands or millions of cells 10.

FIGS. 2A and 2B are, respectively, a plan view and a schematic drawing of an illustrative DRAM cell with a folded bit line architecture. As depicted in FIG. 2A, DRAM memory cells 10 are constructed in pairs, to allow sharing of the digitline contact 22. A dashed line 24 is drawn around a single illustrative memory cell 10. Sharing the digitline contact 22 significantly reduces overall cell size. The memory cell pairs consist of an active area rectangle 26 (in this case N+active area), a pair of metal or polysilicon word lines 16, a single digitline contact 22, a metal or polysilicon digitline 18, and a pair of cell capacitors 12 formed with, for example, oxide-nitride-oxide (O—N—O) dielectric between two layers of polysilicon. Of course, cell dielectric other than O—N—O combinations may be employed, and the cell plates may be formed of a variety of conductive materials, e.g., a metal. For some processes, the word line polysilicon is silicided to reduce the sheet resistance, permitting longer word line segments without reducing speed.

The memory cell layout, shown in FIG. 2A, is essentially under the control of process engineers, since every aspect of the memory bit must meet stringent performance criteria.

The single memory cell 10 shown within the dashed line box 24 in FIG. 2A is by definition an eight square feature (8F²) cell. The intended definition of feature is minimum realizable process dimension, but in actual fact equates to a dimension that is half of the word line (row) or digitline (column) pitch. A 0.25 µm process having word line and digitline pitches of 0.6 µm yields a memory bit size that is 8×(0.3 µm)²=0.72 µm². Explanation of the 8F² designation is easier with the aid of FIG. 2A. The imaginary box 24 drawn around the memory cell 10 defines the cell's outer boundary. Along the x-axis, the box 24 includes ½ of the digitline contact 22 feature (½F), 1 word line 16 feature (1F), 1 capacitor 18 feature (1F), 1 field oxide feature (1F), and ½ poly space feature (½F), which totals to 4 features. Along the y-axis, this box 24 contains two ½ field oxide features and 1 active area 26 feature, which totals to 2 features. The area of the single memory cell 10 is, as defined herein, 4F×2F=8F².

The memory cell array depicted in FIG. 2A has a folded array architecture. This results from the fact that each word line 16 connects (forms a crosspoint) with a memory transistor on every other digitline 18 and must pass around memory transistors as field poly on the remaining digitlines 18. The field poly in each memory cell 10 adds two square features to what would have been a 6F² cell otherwise. Although the folded array yields a cell that is 25% larger than other array architectures, it also produces superior signal-to-noise performance, especially when combined with some form of digitline twisting. Superior low noise performance made folded array architecture the architecture of choice since the 64 kbit generation.

FIG. 2B is a schematic depiction of the illustrative memory cell array depicted in FIG. 2A with a folded digitline architecture. As shown therein, the sense amplifier 30 reads digitlines 18 (D and D*) from the same sub-array (sub-array #1). Using such a construction, all of the noise sources affecting the sense amplifier 30 will have many common nodes that substantially cancel one another. Thus, with folded line architecture, the digitlines 18 are more likely to remain substantially unaffected by external noises and sensing of the difference between D (the sensed line) and D* (the reference line) is easier for the sense amplifier 30.

An alternative to the folded array architecture is the open digitline architecture, popular prior to the 64 kbit generation. FIGS. 3A-3B are, respectively, a plan view and a schematic depiction of such an open digitline architecture. Seen schematically in FIG. 3B, this open digitline architecture also features a sense amplifier 30, but it is positioned between two separate sub-arrays (sub-array #1, sub-array #2). Unlike the folded digitline architecture shown in FIG. 2B, true and complement digitlines 18 (D and D*) connected to each sense amplifier pair come from separate arrays. This precludes the use of digitline twisting to improve signal-to-noise performance and is one reason why the industry has, in general, switched to the folded digitline architecture. Also note that, unlike the folded digitline architecture, each word line 16 in an open digitline architecture connects to memory transistors on every digitline 18—crosspoint style arrays. See FIG. 3A. This feature permits a 25% reduction in memory bit size to only 6F² since the word lines 16 do not have to pass alternate memory cells 10 as field poly. Unfortunately, most manufacturers have found that the signal-tonoise problems of open digitline architecture outweigh the benefits derived from reduced array size. The layout for an array of standard $6F^2$ memory cell pairs is shown in FIG. 3A. A dashed box 28 is drawn around one of the memory cells 10 to show the $6F^2$ cell boundary. Again, two memory cells share a common digitline contact 22 to improve layout efficiency. Along the x-axis, the box 28 includes ½ of the digitline contact 22, one word line 16 feature, one capacitor 12 feature, and ½ of a field oxide feature, for a total of 3 features. Along the y-axis, the box 28 includes two ½ field oxide features and one active area 26 feature, for a total of 2 features. The area of the single memory cell shown in FIG. 3A is $3F \times 2F = 6F^2$.

A thorough understanding of both folded and open digitline architectures by those skilled in the art assists in appreciating the characteristics and benefits of the present invention. The open digitline and folded digitline architectures both have distinct advantages and disadvantages. While open digitline architectures achieve smaller array layouts by virtue of using smaller $6F^2$ memory cells, they also suffer from poor noise performance. A relaxed word line pitch which stems from the $6F^2$ memory cell simplifies the task of word line driver layout. Sense amplifier layout, though, is difficult because the array configuration is inherently half pitch—one sense amplifier for every two digitlines. Folded digitline architectures, on the other hand, have superior signal-to-noise, at the expense of larger, less efficient array layout. Good signal-to-noise performance stems from the adjacency of true and complement digitlines and the capability to twist these digitline pairs. Sense amplifier layout in the folded digitline architecture is simplified because the array configuration is quarter pitch—one sense amplifier for every four digitlines. Word line driver layout is more difficult since the word line pitch is effectively reduced in folded architectures.

The present invention is directed to a device and various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to an approximate $6F^2$ DRAM cell design with a 3F-pitch folded digitline sense amplifier. In one illustrative embodiment, a DRAM device having a plurality of memory cells having an effective size of $6F^2$ is disclosed which has a plurality of dual bit active areas, each of the active areas having a substantially longitudinal axis, and a plurality of digitlines arranged in a folded digitline architecture. The digitlines have a 3F-pitch and the active areas are positioned such that the longitudinal axis of the active areas is oriented at an angle with respect to a centerline of the digitlines.

In another illustrative embodiment, a DRAM device having a plurality of memory cells having an effective size of $6F^2$ is disclosed which has a plurality of dual bit active areas, each of the active areas having rounded ends and a substantially longitudinal axis, and a plurality of digitlines arranged in a folded digitline architecture. The digitlines have a 3F-pitch and the active areas are positioned such that the longitudinal axis of the active areas is oriented at an angle that ranges from approximately 20-80 degrees with respect to a centerline of the digitlines.

In yet another illustrative embodiment, a DRAM device having a plurality of memory cells having an effective size of $6F^2$ is disclosed which has a plurality of dual bit active areas, each of the active areas having a substantially longitudinal axis, a plurality of buried word line structures that extend through the active areas, and a plurality of digitlines arranged in a folded digitline architecture. The digitlines have a 3F-pitch and the active areas are positioned such that the longitudinal axis of the active areas is oriented at an angle that ranges from approximately 20-80 degrees with respect to a centerline of the digitlines.

A method of forming a DRAM device comprised of a plurality of memory cells having an effective size of $6F^2$ is also disclosed. In one illustrative embodiment, the method comprises forming a plurality of dual bit active areas in a semiconducting substrate, each of the active areas having a substantially longitudinal axis, and forming a plurality of digitlines on a 3F-pitch arranged in a folded digitline architecture, wherein the active areas and the digitlines are positioned such that the longitudinal axis of the active areas is oriented at an angle with respect to a centerline of the digitlines.

BRIEF DESCRIPTION OF THE DRAWINGS

The invention may be understood by reference to the following description taken in conjunction with the accompanying drawings, in which like reference numerals identify like elements, and in which.

Figure 1:
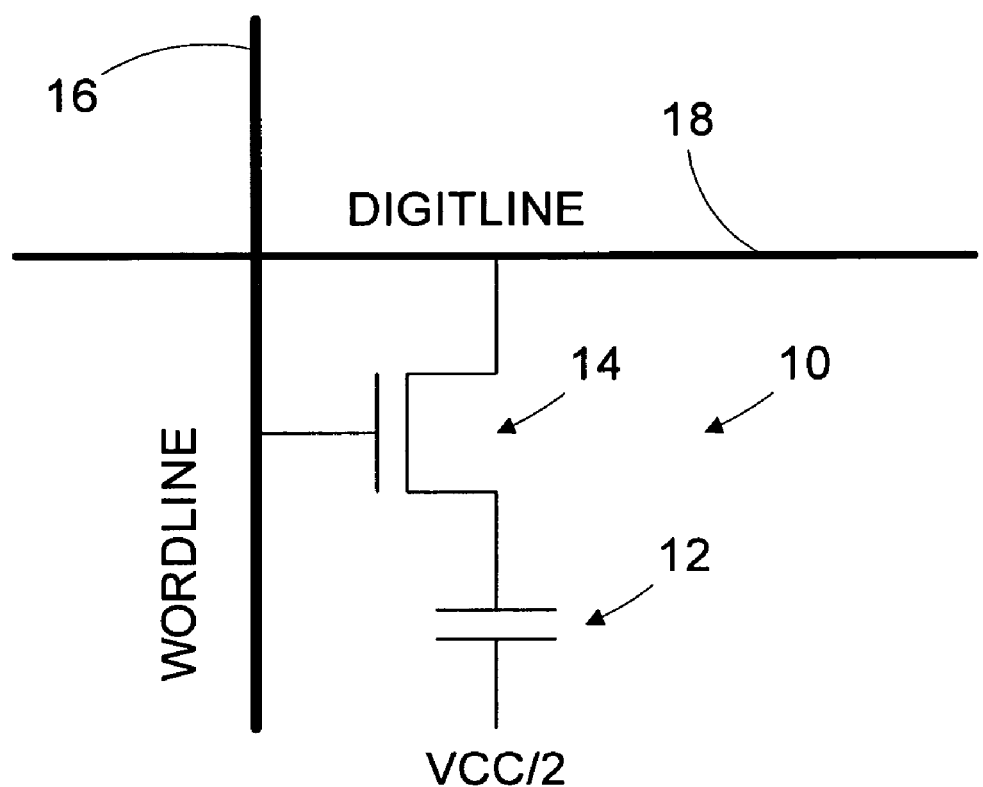
FIG. 1 is a schematic depiction of an illustrative DRAM cell.
Figure 2A:
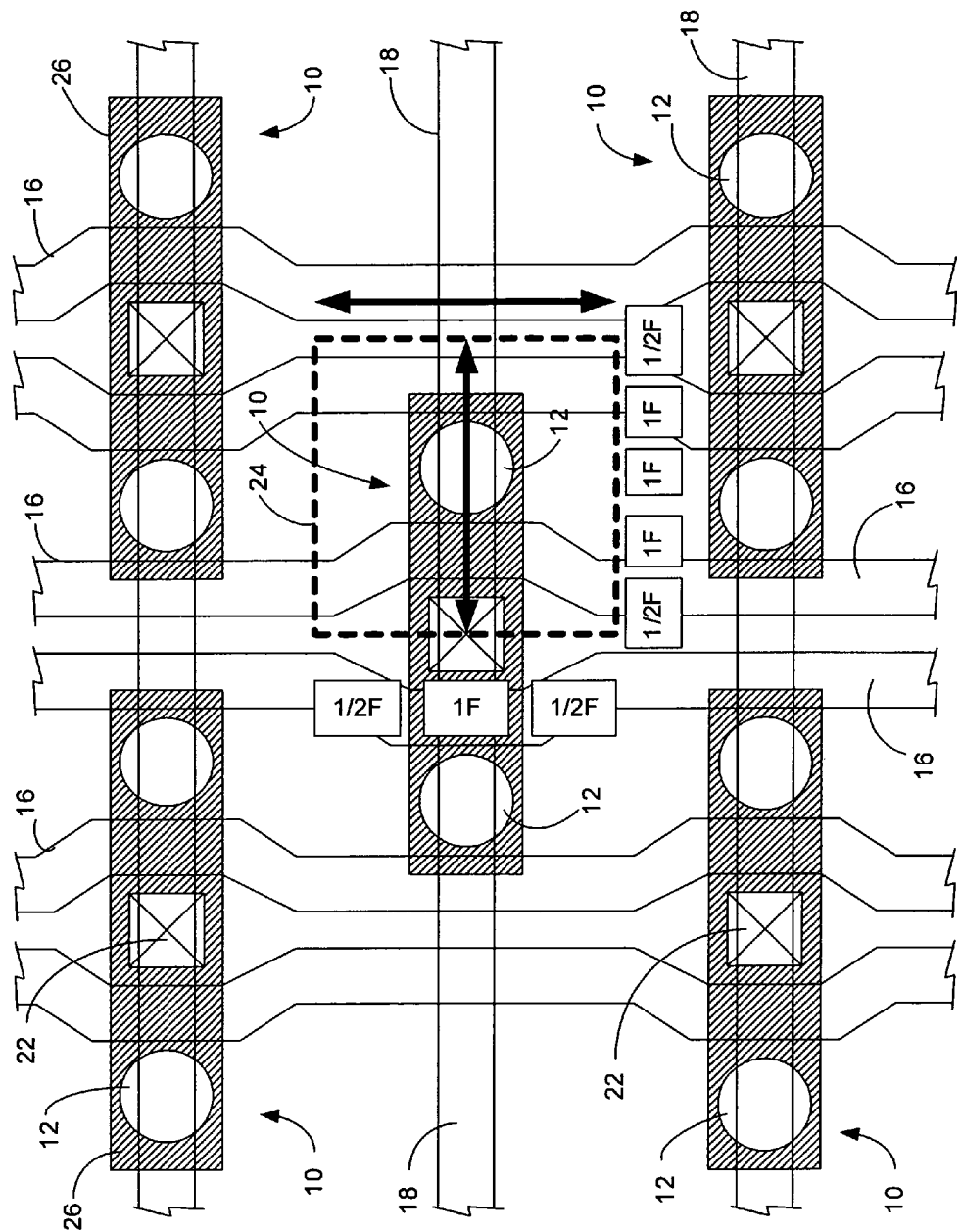
FIGS. 2A-2B depict a prior art DRAM cell with an illustrative folded digitline architecture.
Figure 2B:
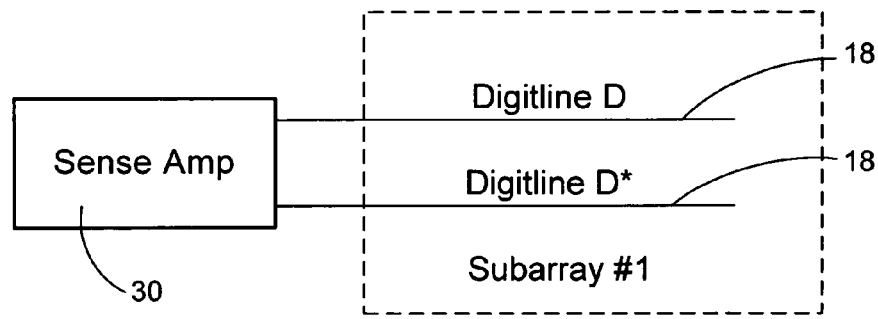
Figure 3B:
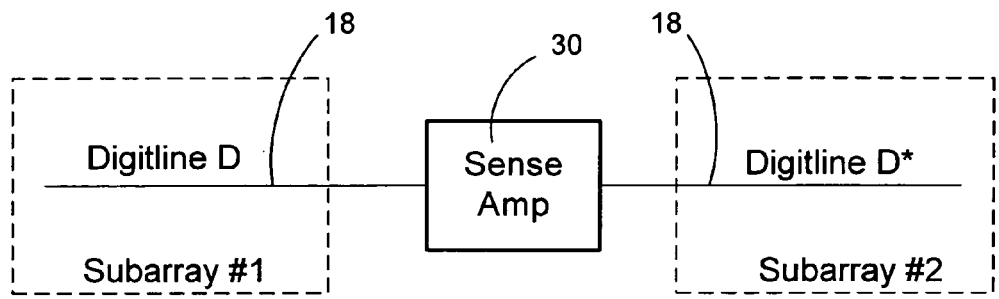
FIGS. 3A-3B depict a prior art DRAM cell with an illustrative open digitline architecture.
Figure 3A:
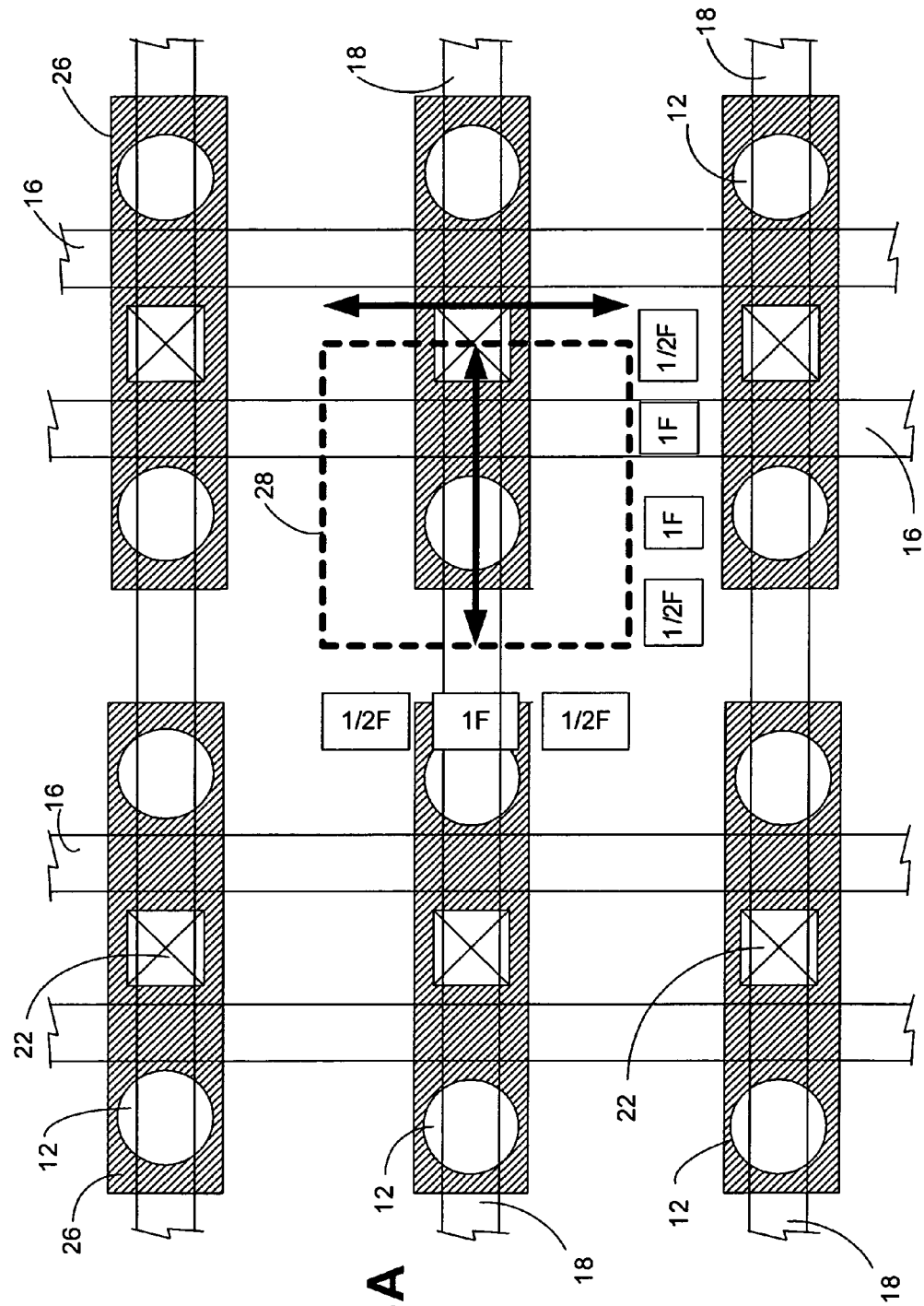

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

Figure 4:
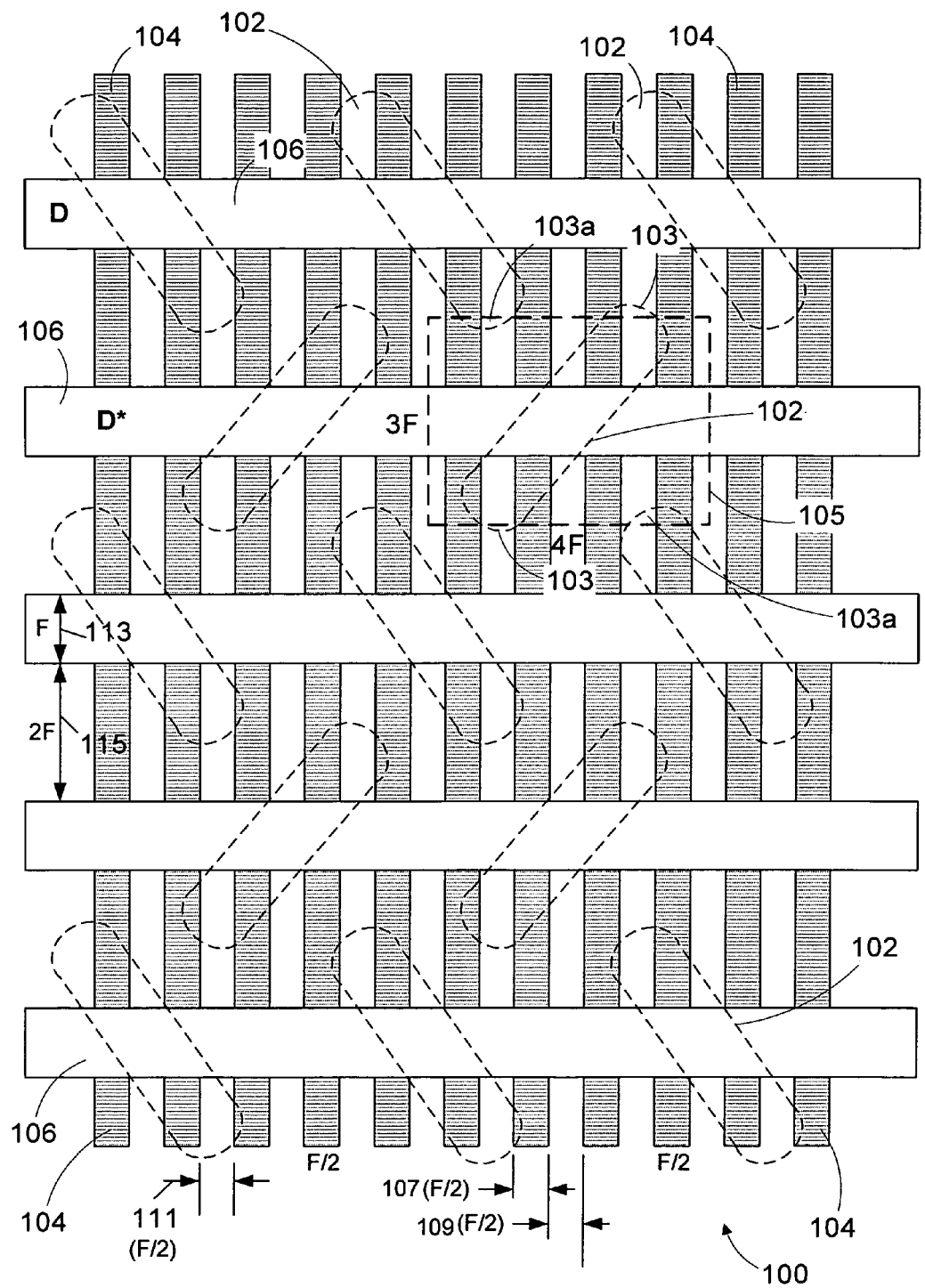
FIG. 4 is a plan view of one illustrative embodiment of the present invention depicting a DRAM cell array with a folded digitline architecture.

FIG. 4 is a plan view depicting one illustrative embodiment of a DRAM memory array 100 in accordance with the present invention. As depicted therein, the array 100 comprises an effective $6F^2$ DRAM cell design with 3F-pitch folded digitline architecture. More specifically, the array 100 comprises a plurality of active areas 102 (indicated by dashed lines), word lines 104 and digitlines 106. The array 104 comprises a folded digitline architecture in that a particular digitline (D) has its associated reference line (D*) positioned adjacent to the digitline D. The principles and advantages behind folded digitline architecture are well known to those skilled in the art. The dashed line 105 indicated in FIG. 4 depicts a footprint for the dual memory cell configuration of $12F^2$ ($3F \times 4F = 12F^2$). Thus, each individual memory cell will have a size of approximately $6F^2$. Note that, in FIG. 4, each of the word lines 104 have a width 107 of F/2. The spacing 111 between adjacent word lines 104 is also F/2. The illustrative digitlines 106 have a width 113 of F and are spaced apart by a distance 115 of 2F, thus resulting in a 3F pitch ("P") for the digitlines 106 in the array.

Note that, in the depicted embodiment, small portions 103 of a particular active area 102 are positioned outside of the 3F×4F box 105. Also note that small portions 103a of the active areas 102 of adjacent cells are positioned within the 3F×4F box 105. Thus, when the array 100 is considered in its entirety, the memory cells have an effective $6F^2$ size. Of course, the exact configuration of the active areas 102 shown in FIG. 4 are provided by way of example only. The active areas 102 of the memory cells may or may not extend into adjacent cell areas. The extent to which the portions 103, 103a extend into adjacent cells may also vary.

Figure 5:
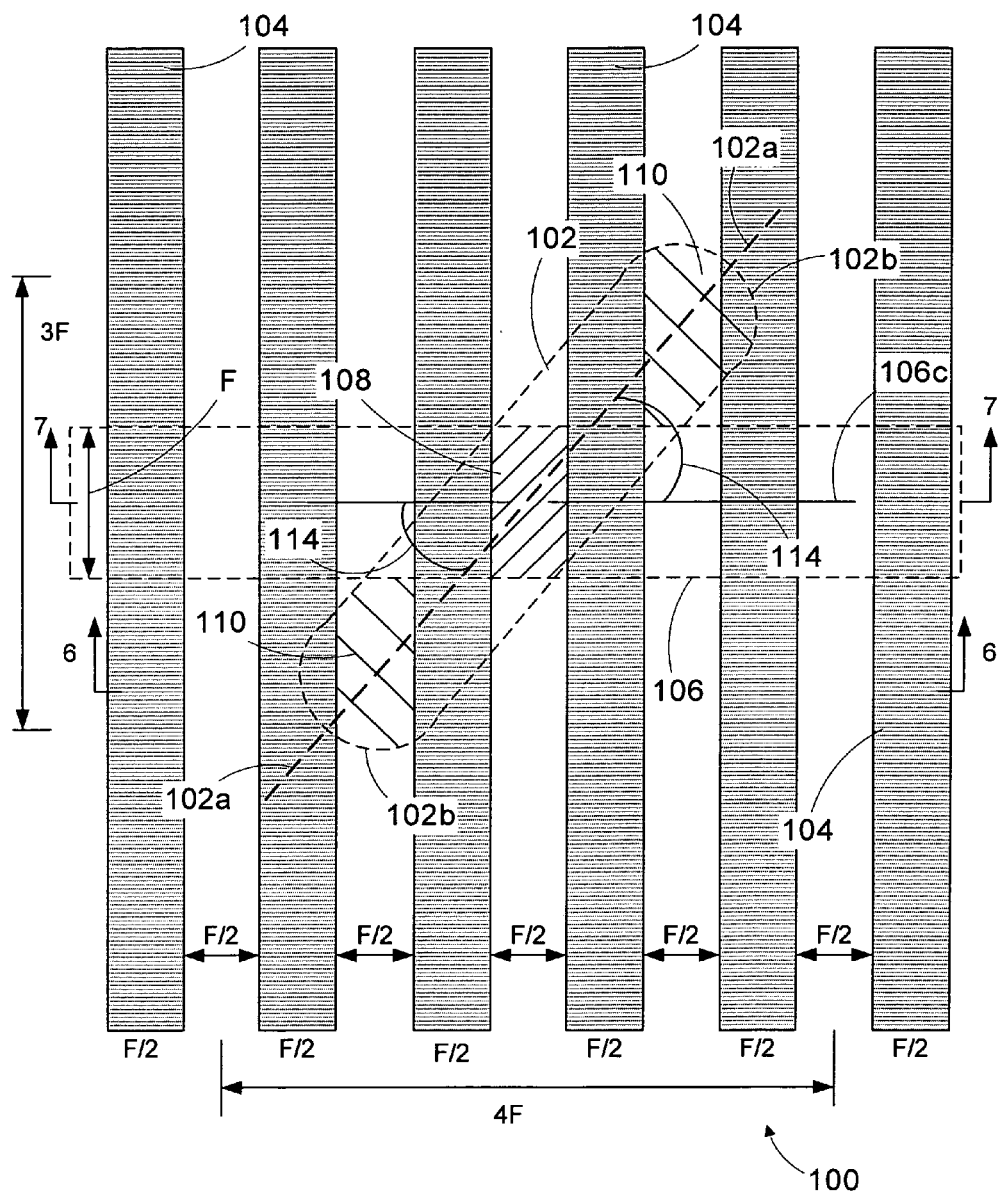
FIG. 5 is an enlarged view of an individual DRAM cell in accordance with one illustrative embodiment of the present invention.
Figure 6:
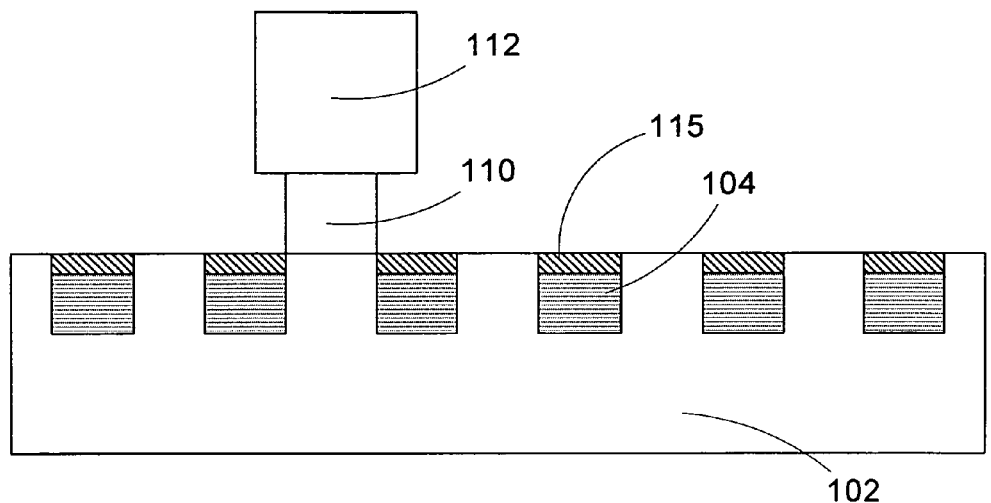
FIG. 6 is a cross-sectional view of the individual DRAM cell depicted in FIG. 5 taken along the line 6-6.
Figure 7:
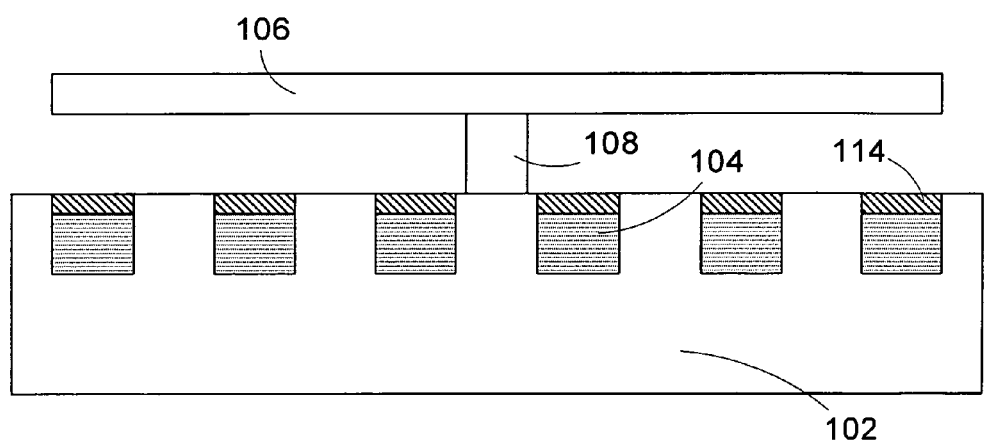
FIG. 7 is a cross-sectional view of the individual DRAM cell depicted in FIG. 5 taken along the line 7-7.

FIG. 5 is an enlarged view of a portion of the array 100 depicted in FIG. 4. FIGS. 6 and 7 are cross-sectional views of FIG. 5 taken along the indicated lines. As shown in these drawings, the dual memory cell arrangement comprises a single digitline contact 108 and two storage capacitor contacts 110. The active area 102 has an approximately longitudinal centerline 102a that is positioned at an angle 114 relative to a reference line, such as the centerline 106c of the digitline 106. The angle 114 may vary to some degree. In one illustrative embodiment, the angle 114 may fall within a range from approximately 20-80 degrees, and in a more particular embodiment approximately 49 degrees, and in an even more particular embodiment approximately 49.58 degrees. Note that the illustrative active area 102 has radiused or rounded ends 102b. Of course, the active area 102 may be of any desired configuration. For example, instead of having radiused or rounded ends 102b, the ends of the active area may be formed to any desired shape, such as a truncated, tabbed, non-rounded shape. The active area 102 can have its ends 102b extend under the adjacent word lines 104, which thereby acts like an insulator passing through the ends of the active area 102.

FIG. 6 depicts the capacitor contact 110 coupled to an illustrative capacitor 112. The exact structure of the capacitor 112 may vary. After reading the present application, those skilled in the art will understand that the capacitor 112 can be of any shape or structure without departing from the scope of the present invention. Also note that, in the illustrative embodiment depicted herein, the word lines 104 or access devices are buried in the active area 102. A layer of insulating material 115 is used to electrically isolate the buried word lines 104 from other structures. Of course, those skilled in the art will recognize after reading the present application that the access devices, i.e., the word lines 104, may be formed above or below the surface of the substrate. Thus, the illustrative depiction of the buried word line 104 structures herein should not be considered a limitation of the present invention.

FIG. 7 is a cross-sectional view depicting the connection between the digitlines 106 and the active area 102 via the digitline contact 108. Various details of construction of the memory cell depicted herein are not shown so as not to obscure the present invention. For example, various implant regions for the access device are not depicted in FIGS. 6 and 7.

The present invention is also directed to forming the DRAM device disclosed herein. In general, the DRAM device may be formed using known processing tools and techniques, e.g., deposition, etching, photolithography, ion implant, heating and polishing processes. The method involves forming the active areas 102 in a semiconducting substrate. The substrate may be made of any type of semiconducting material, e.g., silicon, and it may take a variety of forms, e.g., bulk silicon, silicon-on-insulator (SOI), etc. Typically, the active areas 102 may be formed using known photolithography and ion implantation tools and techniques. The digitlines 106 and word lines 104 may also be formed using known techniques. For example, the digitlines 106 may be formed by patterning a deposited layer of material using known photolithography and etching techniques. The digitlines disclosed herein may be formed such that they have a 3F-pitch. In one illustrative embodiment, the digitlines 106 are formed such that the longitudinal axis 102a of the active area 102 is oriented at an angle 114 with respect to the centerline 106a of the digitlines 106. The active areas 102 may be formed such that they have rounded or non-rounded ends. The method disclosed herein may also involve the formation of a plurality of word lines 104 that may be buried or not buried.

Pursuant to the present invention, the digitlines 106 have an approximate 3F pitch. This is in contrast to many DRAM designs that have a 2F digitline pitch. Assuming that a digitline is 1F wide, by increasing the separation between adjacent digitlines from 1F to 2F, the digitline-to-digitline capacitance may be reduced by approximately 50% using the present invention. Digitline capacitance is a significant source of impedance in reading out the signal from a DRAM cell capacitor (i.e., signal strength=DRAM cell charge/digitline capacitance). All other things being equal, the smaller the digitline capacitance, the larger the readout signal, and the easier the signal is to recognize and process.

The one illustrative example, the present invention is generally directed to a $6F^2$ DRAM cell design with a 3F-pitch folded digitline sense amplifier. In one illustrative embodiment, a DRAM device having a plurality of memory cells having an effective size of $6F^2$ is disclosed which has a plurality of dual bit active areas, each of the active areas having a substantially longitudinal axis, and a plurality of digitlines arranged in a folded digitline architecture. The digitlines have a 3F-pitch and the active areas are positioned such that the longitudinal axis of the active areas is oriented at an angle with respect to a centerline of the digitlines.

In another illustrative embodiment, a DRAM device having a plurality of memory cells having an effective size of $6F^2$ is disclosed which has a plurality of dual bit active areas, each of the active areas having rounded ends and a substantially longitudinal axis, and a plurality of digitlines arranged in a folded digitline architecture. The digitlines have a 3F-pitch and the active areas are positioned such that the longitudinal axis of the active areas is oriented at an angle that ranges from approximately 20-80 degrees with respect to a centerline of the digitlines.

In yet another illustrative embodiment, a DRAM device having a plurality of memory cells having an effective size of $6F^2$ is disclosed which has a plurality of dual bit active areas, each of the active areas having a substantially longitudinal axis, a plurality of buried word line structures that extend through the active areas, and a plurality of digitlines arranged in a folded digitline architecture. The digitlines have a 3F-pitch and the active areas are positioned such that the longitudinal axis of the active areas is oriented at an angle that ranges from approximately 20-80 degrees with respect to a centerline of the digitlines.

The present invention is also directed to a method of forming the DRAM device disclosed herein. In one illustrative embodiment, the method comprises forming a plurality of dual bit active areas in a semiconducting substrate, each of the active areas having a substantially longitudinal axis, and forming a plurality of digitlines arranged in a folded digitline architecture, wherein the active areas and the digitlines are positioned such that the longitudinal axis of the active areas is oriented at an angle with respect to a centerline of the digitlines.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A DRAM device comprised of a plurality of memory cells having an effective size of $6F^2$, comprising:
    a plurality of dual bit active areas, each of said active areas having a substantially longitudinal axis; and
    a plurality of digitlines arranged in a folded digitline architecture, wherein said digitlines have a 3F pitch and wherein said active areas are positioned such that the longitudinal axis of said active areas is oriented at an angle with respect to a centerline of said digitlines.

2. The DRAM device of claim 1, wherein said angle ranges from approximately 20-80 degrees.

3. The DRAM device of claim 1, wherein said angle is approximately 49 degrees.

4. The DRAM device of claim 1, wherein said angle is approximately 49.58 degrees.

5. The DRAM device of claim 1, further comprising a plurality of buried word line structures that extend through said active areas.

6. The DRAM device of claim 1, wherein said active areas have rounded ends.

7. The DRAM device of claim 1, wherein said active areas have non-rounded ends.

8. The DRAM device of claim 1, wherein portions of each of said active areas extend into areas occupied by adjacent memory cells.

9. A DRAM device comprised of a plurality of memory cells having an effective size of $6F^2$, comprising:
    a plurality of dual bit active areas, each of said active areas having rounded ends and a substantially longitudinal axis; and
    a plurality of digitlines arranged in a folded digitline architecture, wherein said digitlines have a 3F pitch and wherein said active areas are positioned such that the longitudinal axis of said active areas is oriented at an angle that ranges from approximately 20-80 degrees with respect to a centerline of said digitlines.

10. The DRAM device of claim 9, further comprising a plurality of buried word line structures that extend through said active areas.

11. The DRAM device of claim 9, wherein portions of each of said active areas extend into areas occupied by adjacent memory cells.

12. A DRAM device comprised of a plurality of memory cells having an effective size of $6F^2$, comprising:
    a plurality of dual bit active areas, each of said active areas having a substantially longitudinal axis;
    a plurality of buried word line structures that extend through said active areas; and
    a plurality of digitlines arranged in a folded digitline architecture, wherein said digitlines have a 3F pitch and wherein said active areas are positioned such that the longitudinal axis of said active areas is oriented at an angle that ranges from approximately 20-80 degrees with respect to a centerline of said digitlines.

13. A method of forming a DRAM device comprised of a plurality of memory cells having an effective size of $6F^2$, comprising:
    forming a plurality of dual bit active areas in a semiconducting substrate, each of said active areas having a substantially longitudinal axis; and
    forming a plurality of digitlines on a 3F-pitch arranged in a folded digitline architecture, wherein said active areas and said digitlines are positioned such that the longitudinal axis of said active areas is oriented at an angle with respect to a centerline of said digitlines.

14. The method of claim 13, wherein said angle ranges from approximately 20-80 degrees.

15. The method of claim 13, wherein said angle is approximately 49 degrees.

16. The method of claim 13, wherein said angle is approximately 49.58 degrees.

17. The method of claim 13, further comprising forming a plurality of buried word line structures that extend through said active areas.

18. The method of claim 13, wherein forming said active areas comprises forming said active areas such that they have rounded ends.

19. The method of claim 13, wherein forming said active areas comprises forming said active areas such that they have non-rounded ends.

20. The method of claim 13, wherein forming said active areas comprises forming said active areas such that portions of each of said active areas extend into areas occupied by adjacent memory cells.

21. A method of forming a DRAM device comprised of a plurality of memory cells having an effective size of $6F^2$, comprising:
forming a plurality of dual bit active areas, each of said active areas having rounded ends and a substantially longitudinal axis; and
forming a plurality of digitlines on a 3F-pitch arranged in a folded digitline architecture, wherein said active areas and said digitlines are positioned such that the longitudinal axis of said active areas is oriented at an angle that ranges from approximately 20-80 degrees with respect to a centerline of said digitlines.

22. The method of claim 21, further comprising forming a plurality of buried word line structures that extend through said active areas.

23. The method of claim 21, wherein forming said active areas comprises forming said active areas such that portions of each of said active areas extend into areas occupied by adjacent memory cells.

24. A method of forming a DRAM device comprised of a plurality of memory cells having an effective size of $6F^2$, comprising:
forming a plurality of dual bit active areas, each of said active areas having a substantially longitudinal axis;
forming a plurality of buried word line structures that extend through said active areas; and
forming a plurality of digitlines on a 3F-pitch arranged in a folded digitline architecture, wherein said active areas and said digitlines are positioned such that the longitudinal axis of said active areas is oriented at an angle that ranges from approximately 20-80 degrees with respect to a centerline of said digitlines.

25. The DRAM device of claim 1, wherein the plurality of digitlines comprise a plurality of pairs of digitlines and reference digitlines arranged in the folded digitline architecture such that each dual bit active area contacts either a digitline or a reference digitline, wherein said digitlines and reference digitlines have a 3F pitch and wherein active areas contacting digitlines are positioned such that the longitudinal axis of said active areas is oriented at a positive value of an angle with respect to a centerline of said digitlines and active areas contacting reference digitlines are positioned such that the longitudinal axis of said active areas is oriented at a negative value of the angle with respect to a centerline of said reference digitlines.

26. The DRAM device of claim 9, wherein the plurality of digitlines comprise a plurality of pairs of digitlines and reference digitlines arranged in the folded digitline architecture such that each dual bit active area contacts either a digitline or a reference digitline, wherein said digitlines and reference digitlines have a 3F pitch and wherein active areas contacting digitlines are positioned such that the longitudinal axis of said active areas is oriented at a positive value of an angle with respect to a centerline of said digitlines and active areas contacting reference digitlines are positioned such that the longitudinal axis of said active areas is oriented at a negative value of the angle with respect to a centerline of said reference digitlines.

27. The DRAM device of claim 12, wherein the plurality of digitlines comprise a plurality of pairs of digitlines and reference digitlines arranged in the folded digitline architecture such that each dual bit active area contacts either a digitline or a reference digitline, wherein said digitlines and reference digitlines have a 3F pitch and wherein active areas contacting digitlines are positioned such that the longitudinal axis of said active areas is oriented at a positive value of an angle with respect to a centerline of said digitlines and active areas contacting reference digitlines are positioned such that the longitudinal axis of said active areas is oriented at a negative value of the angle with respect to a centerline of said reference digitlines.

* * * * *

UNITED STATES PATENT AND TRADEMARK OFFICE
CERTIFICATE OF CORRECTION

| | | |
|---|---|---|
| PATENT NO. | : 7,349,232 B2 | Page 1 of 1 |
| APPLICATION NO. | : 11/376458 | |
| DATED | : March 25, 2008 | |
| INVENTOR(S) | : Fei Wang et al. | |

It is certified that error appears in the above-identified patent and that said Letters Patent is hereby corrected as shown below:

Column 6, line 63, replace "centerline 106a" with --centerline 106c--.

Signed and Sealed this

Thirty-first Day of March, 2009

JOHN DOLL
*Acting Director of the United States Patent and Trademark Office*